(12) United States Patent
Liu et al.

(10) Patent No.: US 12,014,933 B2
(45) Date of Patent: *Jun. 18, 2024

(54) SEMICONDUCTOR DEVICE FABRICATION WITH REMOVAL OF ACCUMULATION OF MATERIAL FROM SIDEWALL

(71) Applicant: TAIWAN SEMICONDUCTOR MANUFACTURING COMPANY LIMITED, Hsin-Chu (TW)

(72) Inventors: Yan-Hong Liu, Zhudong Township (TW); Yeh-Chien Lin, Hsin-Chu (TW); Jin-Huai Chang, Hsin-Chu (TW)

(73) Assignee: TAIWAN SEMICONDUCTOR MANUFACTURING COMPANY LIMITED, Hsin-Chu (TW)

( * ) Notice: Subject to any disclaimer, the term of this patent is extended or adjusted under 35 U.S.C. 154(b) by 59 days.

This patent is subject to a terminal disclaimer.

(21) Appl. No.: 17/562,093

(22) Filed: Dec. 27, 2021

(65) Prior Publication Data

US 2022/0122850 A1   Apr. 21, 2022

Related U.S. Application Data

(63) Continuation of application No. 16/458,616, filed on Jul. 1, 2019, now Pat. No. 11,211,257.

(Continued)

(51) Int. Cl.
  *H01L 21/3213* (2006.01)
  *H01L 21/027* (2006.01)
  *H01L 49/02* (2006.01)

(52) U.S. Cl.
  CPC .... *H01L 21/32135* (2013.01); *H01L 21/0273* (2013.01); *H01L 21/32139* (2013.01); *H01L 28/20* (2013.01); *H01L 28/60* (2013.01)

(58) Field of Classification Search
  CPC .......... H01L 21/0273; H01L 21/31105; H01L 21/31111; H01L 21/31116;
  (Continued)

(56) References Cited

U.S. PATENT DOCUMENTS 6,344,964 B1   2/2002 Adler
6,573,175 B1 *  6/2003 Yin ................... H01L 21/76807
                                                257/E21.252

(Continued)

FOREIGN PATENT DOCUMENTS

EP      1143498 A2   10/2001
JP    H10154712 A    6/1998
(Continued)

*Primary Examiner* — Brook Kebede
(74) *Attorney, Agent, or Firm* — Cooper Legal Group, LLC

(57) ABSTRACT

A method of fabricating a semiconductor device is provided. The method includes forming a first metal layer over a semiconductor substrate, and forming a first layer over the first metal layer. The first layer and first metal layer are etched to expose a sidewall of the first layer and a sidewall of the first metal layer, wherein the etching disburses a portion of the first metal layer to create an accumulation of material on at least one of the sidewall of the first layer or the sidewall of the first metal layer. At least some of the accumulation is etched away using an etchant comprising fluorine.

20 Claims, 9 Drawing Sheets

Related U.S. Application Data

(60) Provisional application No. 62/726,090, filed on Aug. 31, 2018.

(58) Field of Classification Search
CPC ......... H01L 21/32135; H01L 21/32139; H01L 28/20; H01L 28/60
See application file for complete search history.

(56) References Cited

U.S. PATENT DOCUMENTS

| | | |
|---|---|---|
| 11,211,257 B2 * | 12/2021 | Liu ......................... H01L 28/20 |
| 2004/0043620 A1 * | 3/2004 | Ying ................. H01L 21/02071 |
| | | 257/E21.256 |
| 2006/0089003 A1 | 4/2006 | Cheng et al. |
| 2006/0102197 A1 | 5/2006 | Chiang et al. |
| 2007/0232064 A1 * | 10/2007 | Oh .................... H01L 21/76814 |
| | | 438/906 |
| 2009/0142931 A1 * | 6/2009 | Wang ................ H01L 21/02063 |
| | | 216/41 |
| 2016/0035817 A1 | 2/2016 | Hsu et al. |
| 2018/0166329 A1 * | 6/2018 | Huang ................. H01L 29/665 |

FOREIGN PATENT DOCUMENTS

| | | |
|---|---|---|
| TW | 509973 B | 11/2002 |
| TW | 201809248 A | 3/2018 |

\* cited by examiner

SEMICONDUCTOR DEVICE FABRICATION WITH REMOVAL OF ACCUMULATION OF MATERIAL FROM SIDEWALL

RELATED APPLICATION

This application is a continuation of U.S. Non-Provisional patent application Ser. No. 16/458,616, titled "SEMICONDUCTOR DEVICE FABRICATION WITH REMOVAL OF ACCUMULATION OF MATERIAL FROM SIDEWALL" and filed on Jul. 1, 2019, which claims priority to U.S. Provisional Patent Application 62/726,090, titled "REMOVAL OF ACCUMULATION OF MATERIAL DURING SEMICONDUCTOR FABRICATION" and filed on Aug. 31, 2018. U.S. Non-Provisional patent application Ser. No. 16/458,616 and U.S. Provisional Patent Application 62/726,090 are incorporated herein by reference.

BACKGROUND

During semiconductor fabrication, different techniques are used to remove layers or portions of layers used in the building of semiconductor devices. One technique to remove layers or portions of layers is etching. Etching is a process where an etchant, such as a liquid chemical, is applied to a layer or a portion of the layer that is to be removed. The layer or portion of the layer is often removed to expose underlying layers or features or to define a particular pattern in the layer. The layer or portion of the layer to which the etchant is applied has a particular etch selectivity relative to the etchant such that the layer or portion of the layer is removed or etched away by the etchant. Other portions of the layer that are not to be removed are generally covered by a photoresist or hard mask that is not susceptible to the etchant or is susceptible to the etchant to a lesser degree. The portions of the layer that are not to be removed are thus protected from the etchant by the photoresist or hard mask. Once the layer or portion of the layer is etched away, the photoresist or hard mask is removed to reveal the patterned layer or remaining portion(s) of the layer that were not etched away by the etchant.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
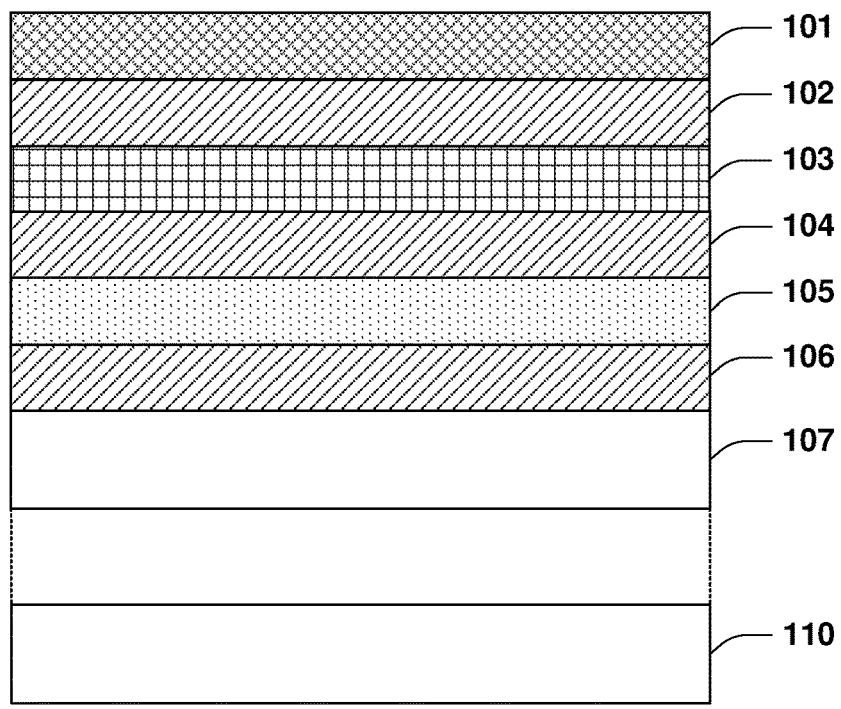
FIGS. 1-11 are illustrations of a semiconductor device, at various stages of fabrication, in accordance with one or more embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

One or more techniques for fabricating a semiconductor device are provided herein. In some embodiments, the semiconductor device comprises a metal insulator metal (MIM) capacitor. In some embodiments, the semiconductor device comprises a resistor. In some embodiments, an accumulation of material is removed from a sidewall of a layer during fabrication of the semiconductor device. In some embodiments, the accumulation of material on the sidewall of the layer results from an etching process performed during fabrication of the semiconductor device. In some embodiments, the accumulation of material is removed by a subsequent etching process. In some embodiments, the subsequent etching process is performed using a gas comprising fluorine as an etchant.

Turning to FIG. 1, a plurality of layers used in the formation of a semiconductor device are illustrated, in accordance with some embodiments. In some embodiments, the semiconductor device comprises a MIM capacitor. The plurality of layers are formed over a substrate 110. In some embodiments, the substrate 110 comprises at least one of an epitaxial layer, a silicon-on-insulator (SOI) structure, a wafer, or a die formed from a wafer.

In some embodiments, an etch stop layer 107 is formed over the substrate 110. In some embodiments, one or more other layers (not shown) are formed between the etch stop layer 107 and the substrate 110. In some embodiments, the etch stop layer 107 is formed by at least one of chemical vapor deposition (CVD), physical vapor deposition (PVD), atomic layer deposition (ALD), or other applicable techniques. In some embodiments, the etch stop layer 107 comprises silicon oxynitride (SION), silicon nitride (SiN), oxide, or other applicable materials.

In some embodiments, a first metal layer 106 is formed over the etch stop layer 107. In some embodiments, the first metal layer 106 is formed by at least one of chemical vapor deposition (CVD), physical vapor deposition (PVD), atomic layer deposition (ALD), or other applicable techniques. According to some embodiments, the first metal layer 106 comprises at least one of titanium (Ti), titanium nitride (TiN), tantalum (Ta), tantalum nitride (TaN), or other applicable materials. In some embodiments, the first metal layer 106 is subjected to chemical mechanical polishing. In some embodiments, the first metal layer 106 is formed to be in direct contact with the etch stop layer 107.

In some embodiments, a second metal layer 105 is formed over the first metal layer 106. In some embodiments, the second metal layer 105 is a capacitor bottom metal (CBM) electrode. In some embodiments, the second metal layer 105 comprises at least one of copper (Cu), aluminum (Al), tantalum (Ta), tantalum nitride (TaN), titanium (Ti), titanium nitride (TiN), or other applicable materials. According to some embodiments, the second metal layer 105 comprises a plurality of layers, such as a layer of Cu, surrounded by one or more layers of at least one of Ta, TaN, Ti, TiN, or other applicable materials. In some embodiments, the second metal layer 105 is an AlCu layer. In some embodiments, the second metal layer 105 is formed by at least one of PVD, CVD, low pressure CVD (LPCVD), atomic layer CVD (ALCVD), ultrahigh vacuum CVD (UHVCVD), reduced pressure CVD (RPCVD), molecular beam epitaxy (MBE), or other applicable techniques. According to some embodiments, the second metal layer 105 is subjected to chemical mechanical polishing (CMP). In some embodiments, the second metal layer 105 is formed to be in direct contact with the first metal layer 106.

In some embodiments, a third metal layer 104 is formed over the second metal layer 105. In some embodiments, the third metal layer 104 is formed by at least one of chemical vapor deposition (CVD), physical vapor deposition (PVD), atomic layer deposition (ALD), or other applicable techniques. In some embodiments, the third metal layer 104 comprises at least one of titanium (Ti), titanium nitride (TiN), tantalum (Ta), tantalum nitride (TaN), or other applicable materials. In some embodiments, the third metal layer 104 is formed to be in direct contact with the second metal layer 105.

In some embodiments, a dielectric layer 103 is formed over the third metal layer 104. According to some embodiments, the dielectric layer 103 is formed by at least one of LPCVD, plasma-enhanced chemical vapor deposition (PECVD), ALCVD, or other applicable techniques. In some embodiments, the dielectric layer 103 comprises at least one of a metal nitride, a high-k dielectric constant material, a rare earth oxide, an aluminate of a rare earth oxide, a silicate of a rare earth oxide, or other applicable materials. According to some embodiments, the dielectric layer 103 comprises at least one of SiN, $SiO_2$, $Si_3N_4$, $TiO_2$, $Ta_2O_5$, $ZrO_2$, $Y_2O_3$, $La_2O_5$, $HfO_2$, or other applicable materials. In some embodiments, a thickness of the dielectric layer 103 will vary depending on the material composition of the dielectric layer 103 and a desired capacitance of a capacitor comprising the dielectric layer 103. In some embodiments, the dielectric layer 103 is formed to be in direct contact with the third metal layer 104.

According to some embodiments, a fourth metal layer 102 is formed over the dielectric layer 103. In some embodiments, the fourth metal layer 102 is formed by at least one of chemical vapor deposition (CVD), physical vapor deposition (PVD), atomic layer deposition (ALD), or other applicable techniques. In some embodiments, the fourth metal layer 102 is a capacitor top metal (CTM) electrode. According to some embodiments, the fourth metal layer 102 comprises at least one of Ta, TaN, Ti, TiN, or other applicable materials.

In some embodiments, the fourth metal layer 102 comprises a plurality of layers. According to some embodiments, the fourth metal layer 102 is formed with a first sublayer, a second sublayer formed over the first sublayer, and a third sublayer formed over the second sublayer. According to some embodiments, the first sublayer comprises a same material composition as the third metal layer 104. According to some embodiments, the first sublayer is formed in a same manner as the third metal layer 104. According to some embodiments, the second sublayer comprises a same material composition as the second metal layer 105. According to some embodiments, the second sublayer is formed in a same manner as the second metal layer 105. According to some embodiments, the third sublayer comprises a same material composition as the first metal layer 106. According to some embodiments, the third sublayer is formed in a same manner as the first metal layer 106.

In some embodiments, the fourth metal layer 102 comprises a lower metal layer comprising a metal nitride. According to some embodiments, the lower metal layer of the fourth metal layer 102 comprises TiN, TaN, or other applicable materials. According to some embodiments, the lower metal layer of the fourth metal layer 102 functions as a diffusion barrier. In some embodiments, the fourth metal layer 102 is formed to be in direct contact with the dielectric layer 103.

In some embodiments, a metal layer (not shown) is formed over the fourth metal layer 102. According to some embodiments, the metal layer over the fourth metal layer 102 is formed in a same manner as at least one of the first metal layer 106 or the third metal layer 104. In some embodiments, a metal layer (not shown) is between the fourth metal layer 102 and the dielectric layer 103. According to some embodiments, the metal layer between the fourth metal layer 102 and the dielectric layer 103 is formed in a same manner as at least one of the first metal layer 106 or the third metal layer 104.

According to some embodiments, a photoresist layer 101 is formed over the fourth metal layer 102. In some embodiments, the photoresist layer 101 is formed by at least one of spinning, spray coating, or other applicable techniques. The photoresist layer 101 comprises a light sensitive material such that properties, such as solubility, of the photoresist layer 101 are affected by light. The photoresist layer is either a negative photoresist or a positive photoresist. With respect to a negative photoresist, regions of the negative photoresist become insoluble when illuminated by a light source such that application of a solvent to the negative photoresist during a subsequent development stage removes non-illuminated regions of the negative photoresist. A pattern formed in the negative photoresist is thus a negative of a pattern defined by opaque regions of a template between the light source and the negative photoresist. In a positive photoresist, illuminated regions of the positive photoresist become soluble and are removed via application of a solvent during development. Thus, a pattern formed in the positive photoresist is a positive image of opaque regions of the template between the light source and the positive photoresist. In some embodiments, the photoresist layer 101 is formed to be in direct contact with the fourth metal layer 102.

Figure 2:
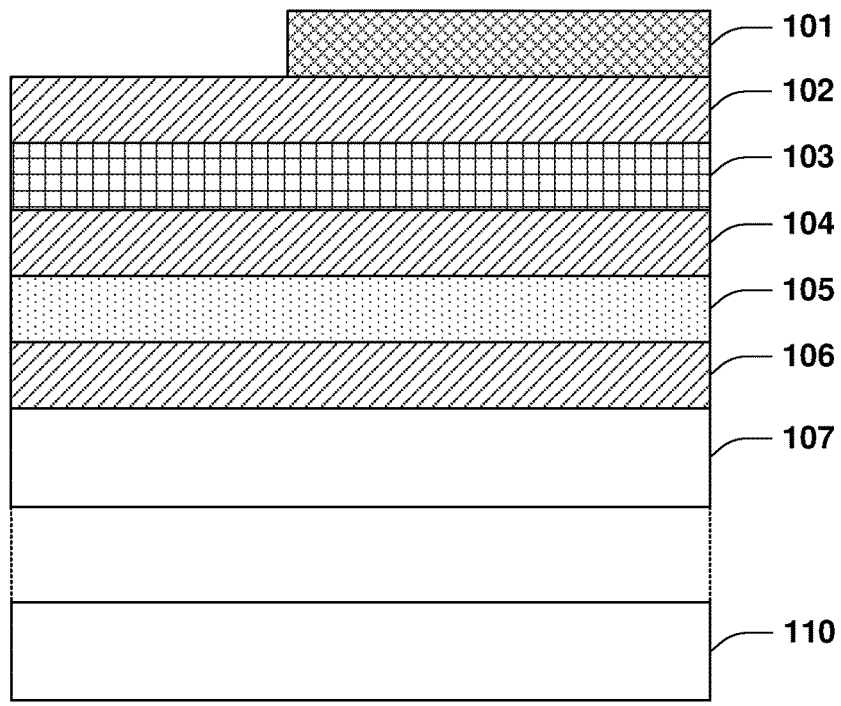

Referring to FIG. 2, the photoresist layer 101 is patterned to expose a portion of the fourth metal layer 102, in accordance with some embodiments.

Figure 3:
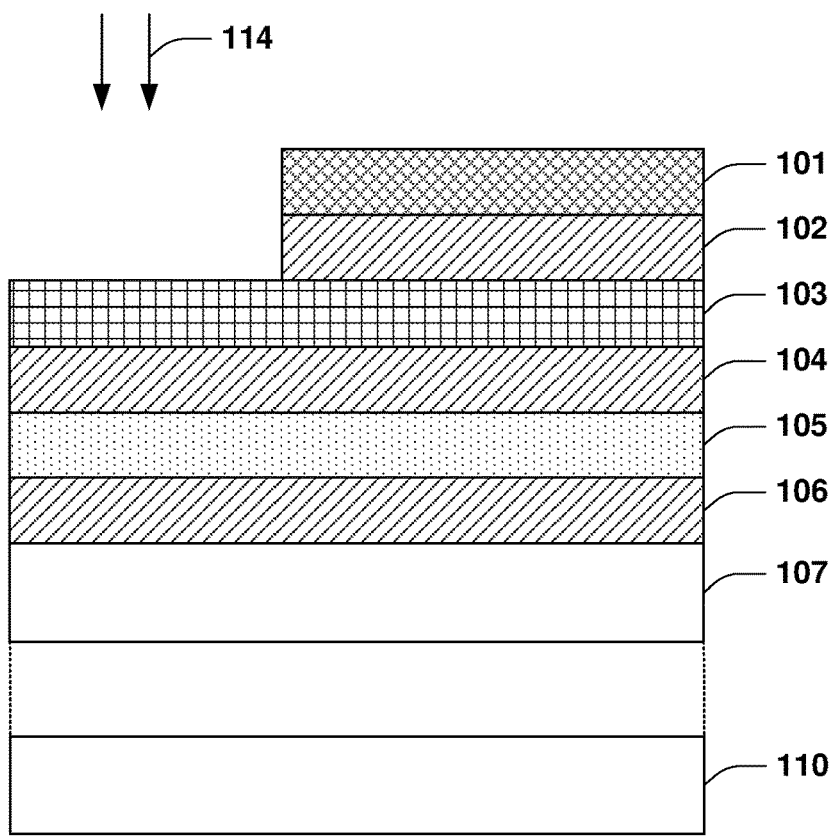

Referring to FIG. 3, the portion of the fourth metal layer 102 not covered by the patterned photoresist layer 101 is removed by an etching process 114 to expose a portion of the dielectric layer 103, in accordance with some embodiments. In some embodiments, the etching process 114 is at least one of a plasma etching process, a reactive ion etching (RIE) process, a wet etching process, or other applicable techniques. In some embodiments, the etching process 114 utilizes at least one of $CF_4$, $Cl_2$, $CHF_3$, or other applicable materials. In some embodiments, one or more of the materials utilized in the etching process 114 are gaseous.

Figure 4:
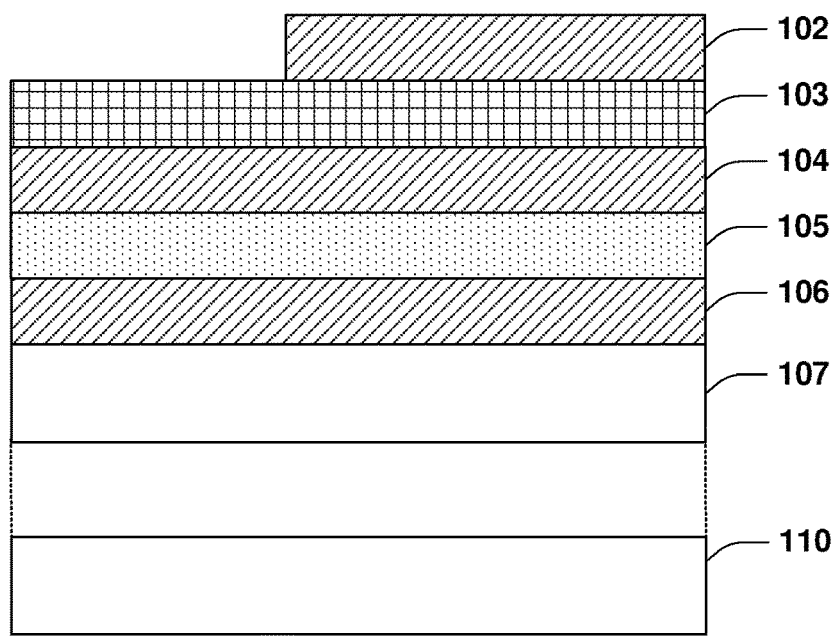

Referring to FIG. 4, the photoresist layer 101 is removed to expose a portion of the fourth metal layer 102 underlying the photoresist layer 101, in accordance with some embodiments.

Figure 5:
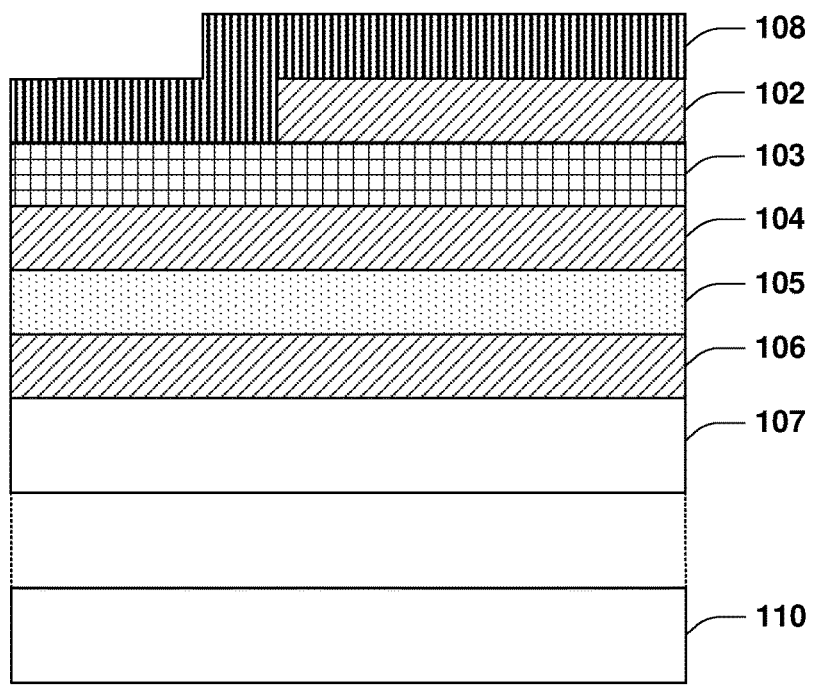

Referring to FIG. 5, a second dielectric layer 108 is formed over the fourth metal layer 102 and the exposed portion of the dielectric layer 103, in accordance with some embodiments. According to some embodiments, the second dielectric layer 108 is formed by at least one of LPCVD, PECVD, or ALCVD. In some embodiments, the second dielectric layer 108 comprises at least one of a nitride, a high-k dielectric constant material, a rare earth oxide, an aluminate of a rare earth oxide, a silicate of a rare earth oxide, or other applicable materials. According to some embodiments, the second dielectric layer 108 comprises at least one of SiN, $SiO_2$, $Si_3N_4$, $TiO_2$, $Ta_2O_5$, $ZrO_2$, $Y_2O_3$, $La_2O_5$, $HfO_2$, or other applicable materials. In some embodiments, the second dielectric layer 108 is formed to be in direct contact with the fourth metal layer 102. In some embodiments, the second dielectric layer 108 is formed to be in direct contact with the dielectric layer 103. In some embodiments, the second dielectric layer 108 comprises a same material composition as the dielectric layer 103. In some embodiments, the second dielectric layer 108 does not comprise a same material composition as the dielectric layer 103. In some embodiments, the second dielectric layer 108 functions as a passivation layer.

Figure 6:
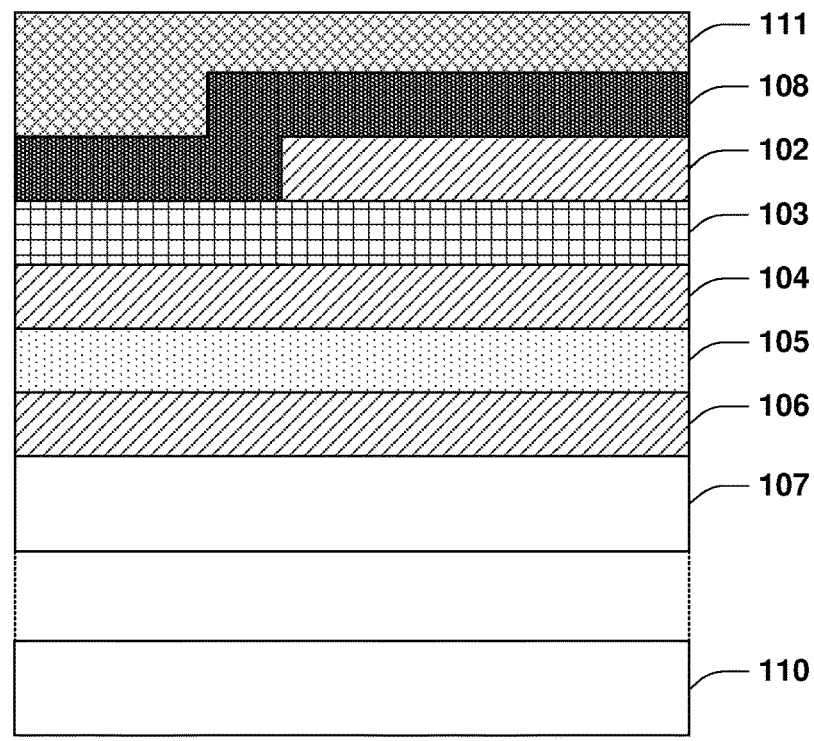

Referring to FIG. 6, a second photoresist layer 111 is formed over the second dielectric layer 108, in accordance with some embodiments. In some embodiments, the second photoresist layer 111 is formed by at least one of spinning, spray coating, or other applicable techniques. In some embodiments, the second photoresist layer 111 is formed to be in direct contact with the second dielectric layer 108.

Figure 7:
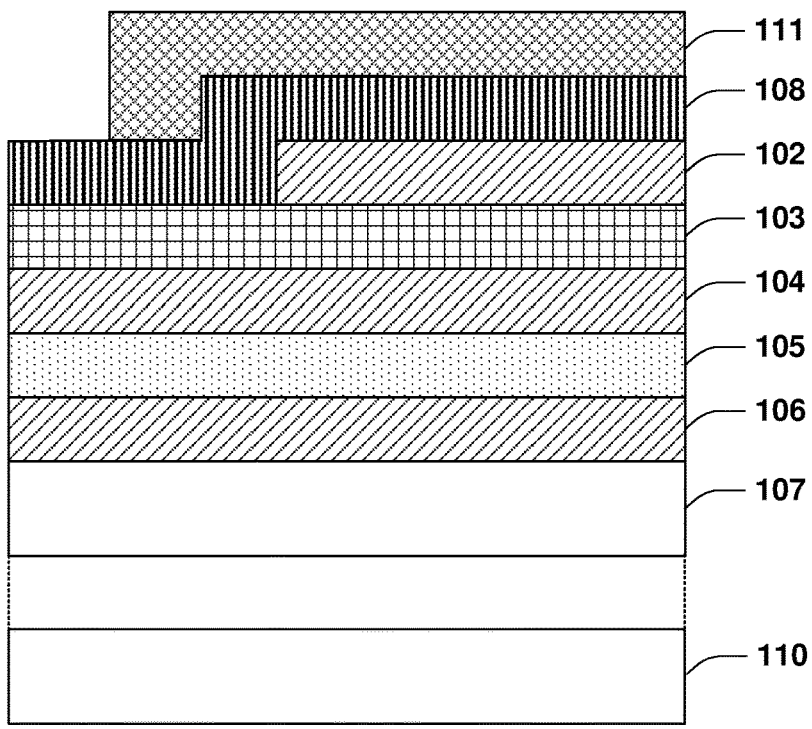

Referring to FIG. 7, the second photoresist layer 111 is patterned to expose a portion of the second dielectric layer 108, in accordance with some embodiments.

Figure 8:
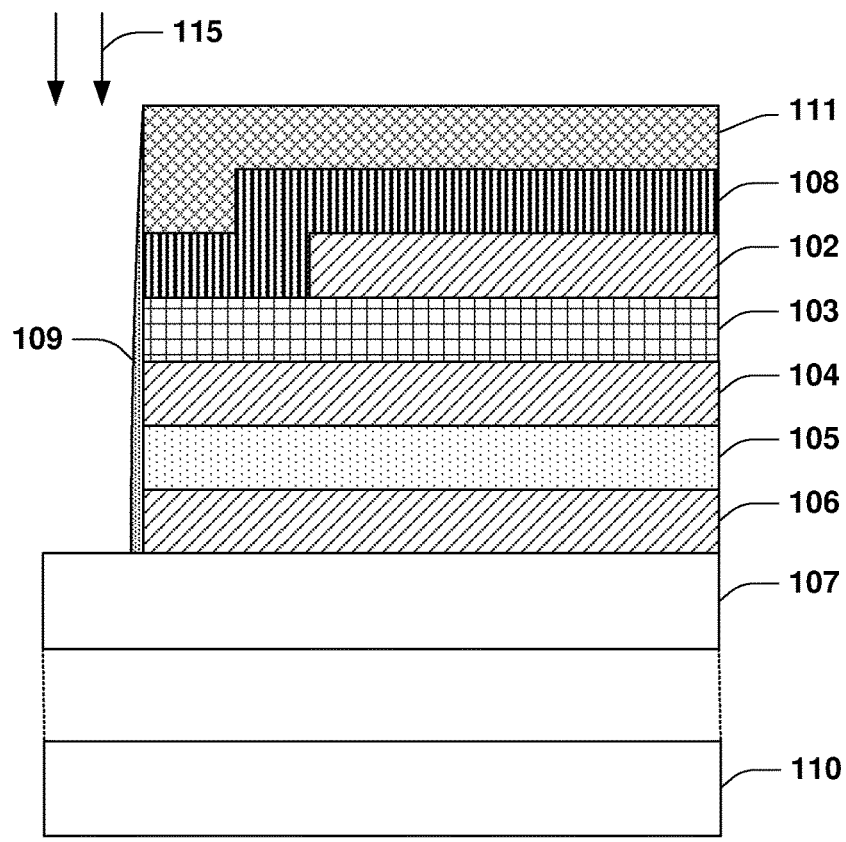

Referring to FIG. 8, the portion of the second dielectric layer 108 not covered by the second photoresist layer 111, as well as portions of the dielectric layer 103, the third metal layer 104, the second metal layer 105, and the first metal layer 106 also not covered by the second photoresist layer 111, are removed by an etching process 115 to expose a portion of the etch stop layer 107, in accordance with some embodiments. In some embodiments, the etching process 115 is at least one of a plasma etching process, a reactive ion etching (RIE) process, a wet etching process, or other applicable techniques. In some embodiments, the etching process 115 utilizes at least one of $CF_4$, $Cl_2$, $CHF_3$, or other applicable materials. In some embodiments, one or more of the materials utilized in the etching process 115 are gaseous. While FIG. 8 illustrates the etching process 115 as etching through the second dielectric layer 108, the dielectric layer 103, the third metal layer 104, the second metal layer 105, and the first metal layer 106, in some embodiments fewer than all of these layers are etched through during the etching process 115. According to some embodiments, the etching process 115 does not etch through some or any of the first metal layer 106 such that the etch stop layer 107 is not exposed by the etching process 115.

In some embodiments, the etching process 115 forms an accumulation of material 109 on a sidewall of at least one of the second photoresist layer 111, the second dielectric layer 108, the dielectric layer 103, the third metal layer 104, the second metal layer 105, or the first metal layer 106. In some embodiments, the accumulation of material 109 comprises a metal polymer. In some embodiments, one or more of the layers being etched by the etching process 115 comprise at least one of TaN, TiN, silicon, or other applicable materials, and the accumulation of material 109 comprises at least one of Ta, Ti, silicon, or other applicable materials from one or more of the layers being etched by the etching process 115. In some embodiments, the accumulation of material 109 comprises elements from a gas used in the etching process 115, such as carbon or other applicable materials.

Figure 9:
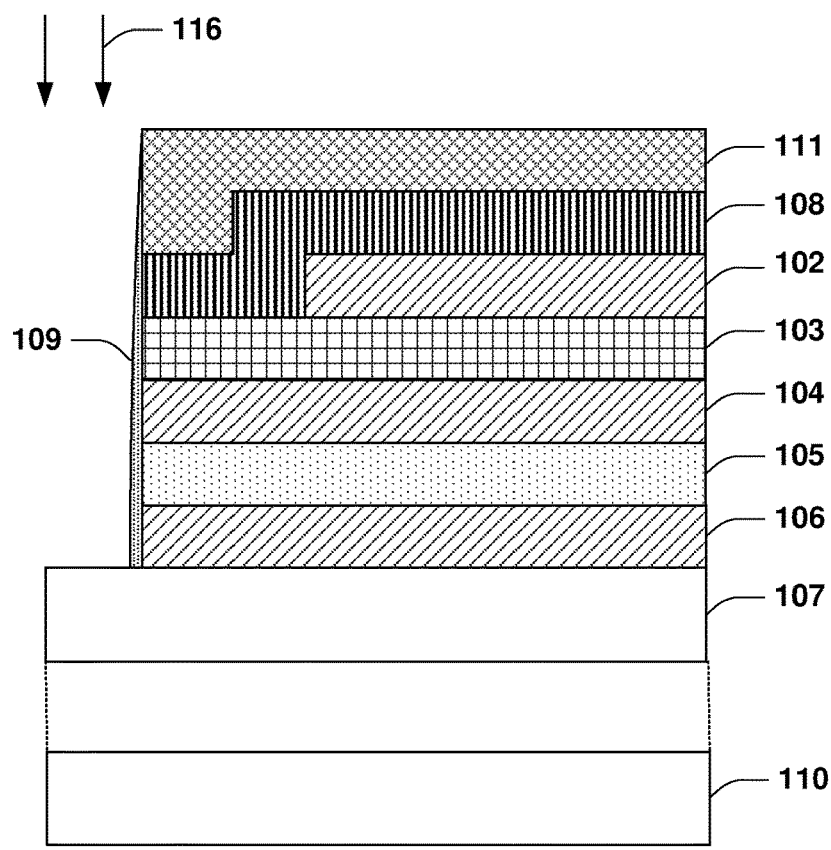

Referring to FIG. 9, at least a portion of the accumulation of material 109 is removed by an etching process 116, in accordance with some embodiments. In some embodiments, the etching process 116 is at least one of a plasma etching process, a reactive ion etching (RIE) process, a wet etching process, or other applicable techniques. According to some embodiments, the etching process 116 utilizes fluorine. According to some embodiments, the etching process 116 utilizes at least one of $CF_4$, $SF_6$, $NF_3$, $CHF_3$, or other applicable materials. In some embodiments, one or more of the materials utilized in the etching process 116 are gaseous. According to some embodiments, the etching process 116 is different than the etching process 115 at least in terms of at least one of pressure, temperature, etchants, or other applicable parameters such that the accumulation of material 109 formed by the etching process 115 is removed by the etching process 116.

Figure 10:
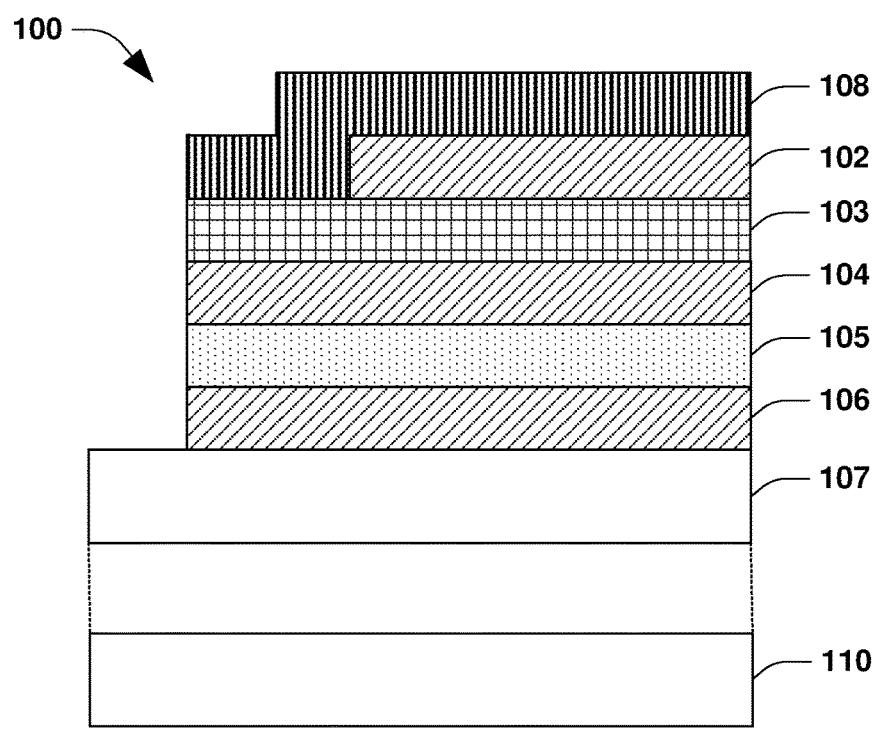

Referring to FIG. 10, the second photoresist layer 111 is removed to expose a portion of the second dielectric layer 108 underlying the second photoresist layer 111, in accordance with some embodiments. According to some embodiments, a resulting semiconductor device 100 comprises a MIM capacitor. In some embodiments, the MIM capacitor comprises the dielectric layer 103, the fourth metal layer 102, and at least one of the third metal layer 104, the second metal layer 105, or the first metal layer 106. According to some embodiments, the accumulation of material 109 is electrically conductive, and the removal of the accumulation of material 109 mitigates leakage that may otherwise occur between layers in contact with the accumulation of material 109.

Figure 11:
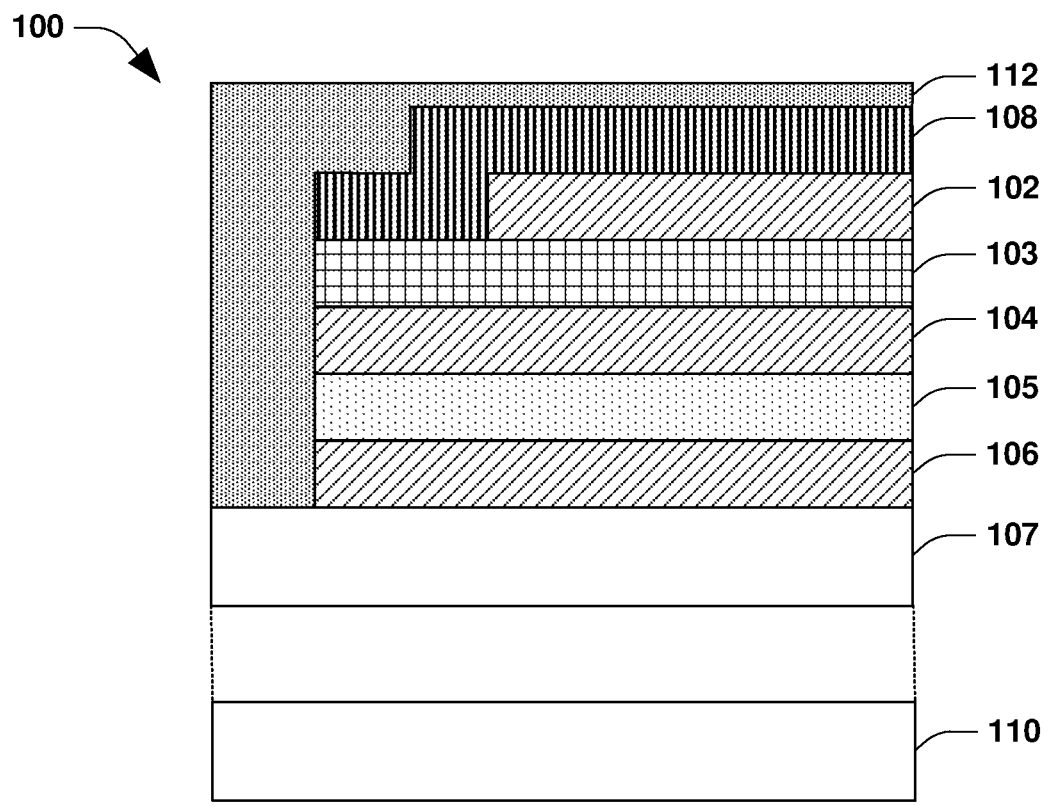

Referring to FIG. 11, a third dielectric layer 112 is formed over the second dielectric layer 108 and the etch stop layer 107, in accordance with some embodiments. According to some embodiments, the third dielectric layer 112 functions to isolate the semiconductor device 100 for back end of line (BEOL) metallization. In some embodiments, the third dielectric layer 112 is formed by at least one of ALD, CVD, PVD, or other applicable techniques. In some embodiments, the third dielectric layer 112 comprises at least one of a nitride, a high-k dielectric constant material, or other applicable materials. In some embodiments, the third dielectric layer 112 is formed to be in direct contact with the second dielectric layer 108. In some embodiments, the third dielectric layer 112 is formed to be in direct contact with the etch stop layer 107. According to some embodiments, the third dielectric layer 112 is formed to be in direct contact with a sidewall of at least one of the second dielectric layer 108, the dielectric layer 103, the third metal layer 104, the second metal layer 105, or the first metal layer 106. In some embodiments, the third dielectric layer 112 comprises a same material composition as the second dielectric layer 108. In some embodiments, the third dielectric layer 112 does not comprise a same material composition as the second dielectric layer 108.

Figure 12:
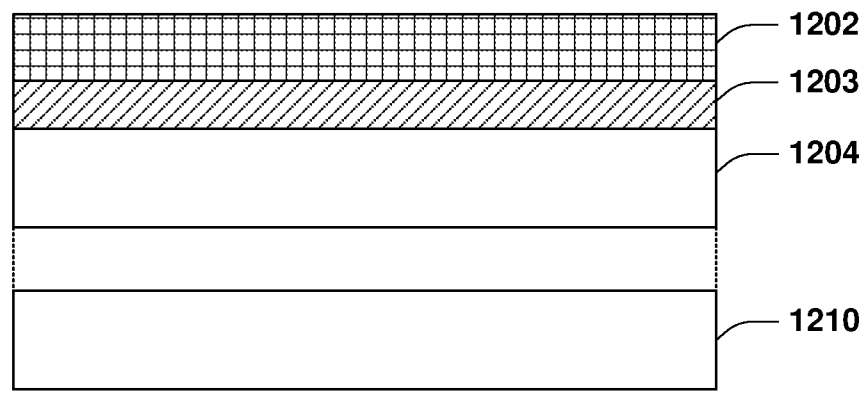
FIGS. 12-18 are illustrations of a semiconductor device, at various stages of fabrication, in accordance with one or more embodiments.

Turing to FIG. 12, a plurality of layers used in the formation of a semiconductor device are illustrated, in accordance with some embodiments. In some embodiments, the semiconductor device comprises a resistor. The plurality of layers are formed over a substrate 1210. In some embodiments, the substrate 1210 comprises at least one of an epitaxial layer, a silicon-on-insulator (SOI) structure, a wafer, or a die formed from a wafer.

In some embodiments, an etch stop layer 1204 is formed over the substrate 1210. In some embodiments, one or more other layers (not shown) are formed between the etch stop layer 1204 and the substrate 1210. In some embodiments, the etch stop layer 1204 is formed by at least one of chemical vapor deposition (CVD), physical vapor deposition (PVD), atomic layer deposition (ALD), or other applicable techniques. In some embodiments, the etch stop layer 1204 comprises silicon oxynitride (SION), silicon nitride (SiN), oxide, or other applicable materials.

In some embodiments, a first metal layer 1203 is formed over the etch stop layer 1204. In some embodiments, the first metal layer 1203 is formed by at least one of chemical vapor deposition (CVD), physical vapor deposition (PVD), atomic layer deposition (ALD), or other applicable techniques. According to some embodiments, the first metal layer 1203 comprises at least one of titanium (Ti), titanium nitride (TiN), tantalum (Ta), tantalum nitride (TaN), or other applicable materials. In some embodiments, the first metal layer 1203 is subjected to chemical mechanical polishing. In some embodiments, the first metal layer 1203 is formed to be in direct contact with the etch stop layer 1204.

In some embodiments, a dielectric layer 1202 is formed over the first metal layer 1203. According to some embodiments, the dielectric layer 1202 is formed by at least one of LPCVD, PECVD, ALCVD, or other applicable techniques. In some embodiments, the dielectric layer 1202 comprises at least one of a metal nitride, a high-k dielectric constant material, a rare earth oxide, an aluminate of a rare earth oxide, a silicate of a rare earth oxide, or other applicable materials. According to some embodiments, the dielectric layer 1202 comprises at least one of SiN, $SiO_2$, $Si_3N_4$, $TiO_2$, $Ta_2O_5$, $ZrO_2$, $Y_2O_3$, $La_2O_5$, $HfO_2$, or other applicable materials. It will be appreciated that a thickness of the dielectric layer 1202 will vary depending on the material composition of the dielectric layer 1202 and a desired resistance of a resistor comprising the dielectric layer 1202. In some embodiments, the dielectric layer 1202 is formed to be in direct contact with the first metal layer 1203.

Figure 13:
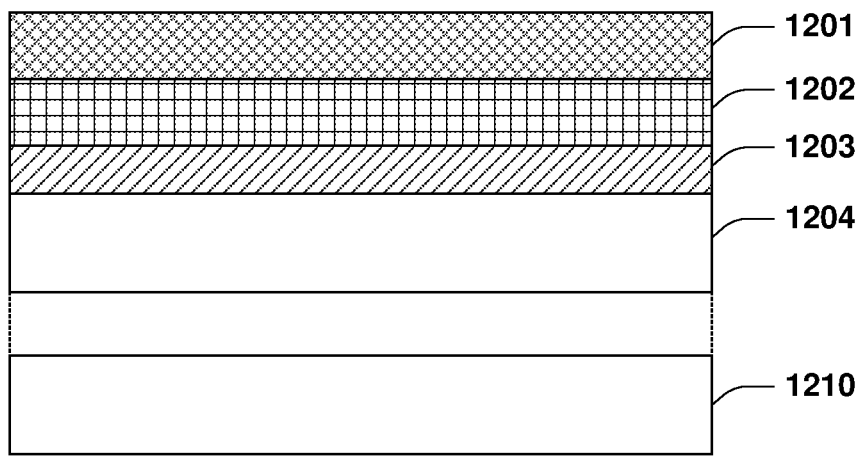

Referring to FIG. 13, a photoresist layer 1201 is formed over the dielectric layer 1202, in accordance with some embodiments. In some embodiments, the photoresist layer 1201 is formed by at least one of spinning, spray coating, or other applicable techniques. The photoresist layer 1201 comprises a light sensitive material such that properties, such as solubility, of the photoresist layer 1201 are affected by light. The photoresist layer is either a negative photoresist or a positive photoresist. With respect to a negative photoresist, regions of a negative photoresist become insoluble when illuminated by a light source such that application of a negative solvent to the photoresist during a subsequent development stage removes non-illuminated regions of the negative photoresist. A pattern formed in the negative photoresist is thus a negative of a pattern defined by opaque regions of a template between the light source and the negative photoresist. In a positive photoresist, illuminated regions of the positive photoresist become soluble and are removed via application of a solvent during development. Thus, a pattern formed in the positive photoresist is a positive image of opaque regions of the template between the light source and the positive photoresist. In some embodiments, the photoresist layer 1201 is formed to be in direct contact with the dielectric layer 1202.

Figure 14:
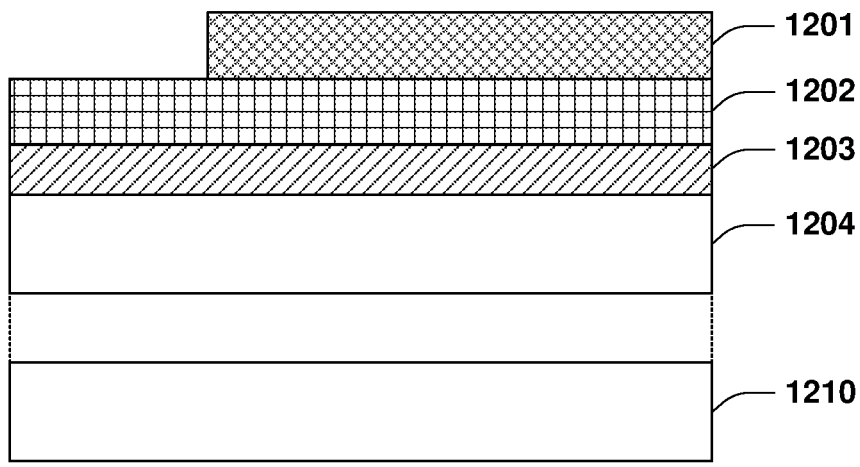

Referring to FIG. 14 the photoresist layer 1201 is patterned to expose a portion of the dielectric layer 1202, in accordance with some embodiments.

Figure 15:
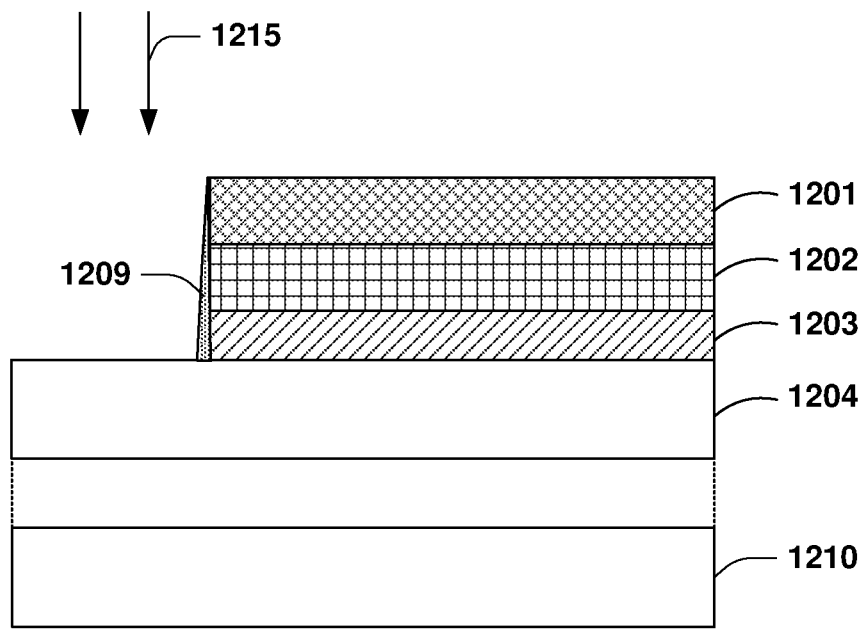

Referring to FIG. 15, the portion of the dielectric layer 1202 not covered by the photoresist layer 1201, as well a portion of the first metal layer 1203 also not covered by the photoresist layer 1201, are removed by an etching process 1215 to expose a portion of the etch stop layer 1204, in accordance with some embodiments. In some embodiments, the etching process 1215 is at least one of a plasma etching process, a reactive ion etching (RIE) process, a wet etching process, or other applicable techniques. In some embodiments, the etching process 1215 utilizes at least one of $CF_4$, $Cl_2$, $CHF_3$, or other applicable materials. In some embodiments, one or more of the materials utilized in the etching process 1215 are gaseous. While FIG. 15 illustrates the etching process 1215 as etching through the dielectric layer 1202 and the first metal layer 1203, in some embodiments fewer than all of these layers are etched through during the etching process 1215. According to some embodiments, the etching process 1215 does not etch through some or any of the first metal layer 1203 such that the etch stop layer 1204 is not be exposed by the etching process 1215.

In some embodiments, the etching process 1215 forms an accumulation of material 1209 on a sidewall of at least one of the photoresist layer 1201, the dielectric layer 1202, or the first metal layer 1203. In some embodiments, the accumulation of material 1209 comprises a metal polymer. In some embodiments, one or more of the layers being etched by the etching process 1215 comprise at least one of TaN, TiN, silicon, or other applicable materials, and the accumulation of material 1209 comprises at least one of Ta, Ti, silicon, or other applicable materials from one or more of the layers being etched by the etching process 1215. In some embodiments, the accumulation of material 1209 comprises elements from a gas used in the etching process 1215, such as carbon or other applicable materials.

Figure 16:
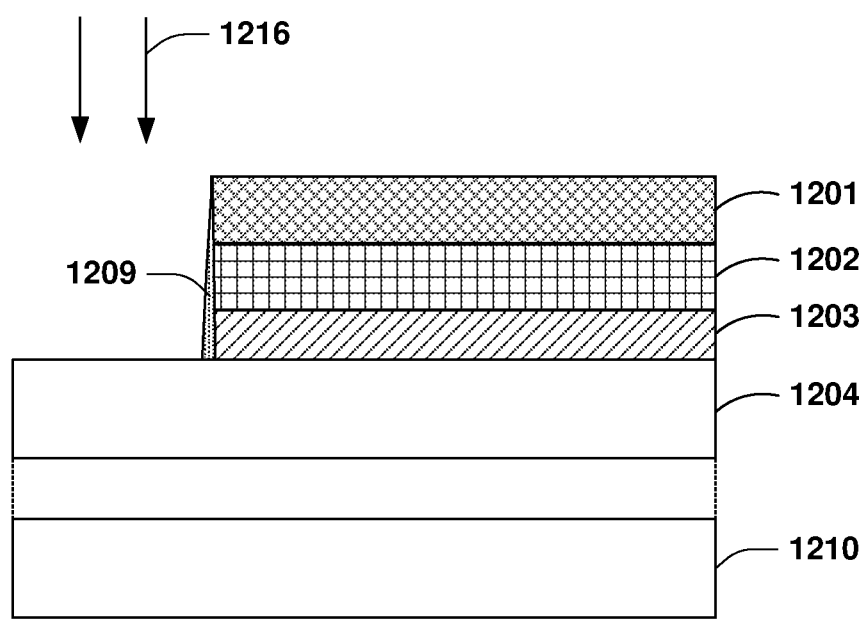

Referring to FIG. 16, at least a portion of the accumulation of material 1209 is removed by an etching process 1216, in accordance with some embodiments. In some embodiments, the etching process 1216 is at least one of a plasma etching process, a reactive ion etching (RIE) process, a wet etching process, or other applicable techniques. According to some embodiments, the etching process 1216 utilizes fluorine. According to some embodiments, the etching process 1216 utilizes at least one of $CF_4$, $SF_6$, $NF_3$, $CHF_3$, or other applicable materials. In some embodiments, one or more of the materials utilized in the etching process 1216 are gaseous. According to some embodiments, the etching process 1216 is different than the etching process 1215 at least in terms of at least one of pressure, temperature, etchants, or other applicable parameters such that the accumulation of material 1209 formed by the etching process 1215 is removed by the etching process 1216.

Figure 17:
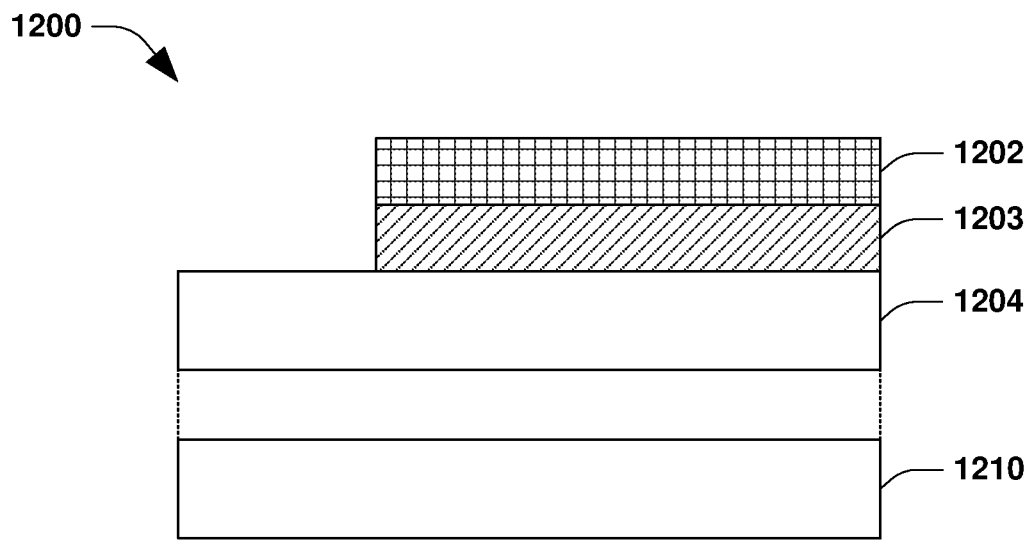

Referring to FIG. 17, the photoresist layer 1201 is removed to expose a portion of the dielectric layer 1202 underlying the photoresist layer 1201, in accordance with some embodiments. According to some embodiments, a resulting semiconductor device 1200 comprises a resistor. In some embodiments, the resistor comprises the dielectric layer 1202 over the first metal layer 1203. According to some embodiments, the accumulation of material 1209 is electrically conductive such that removal of the accumulation of material 1209 mitigates leakage that may otherwise occur between layers in contact with the accumulation of material 1209.

Figure 18:
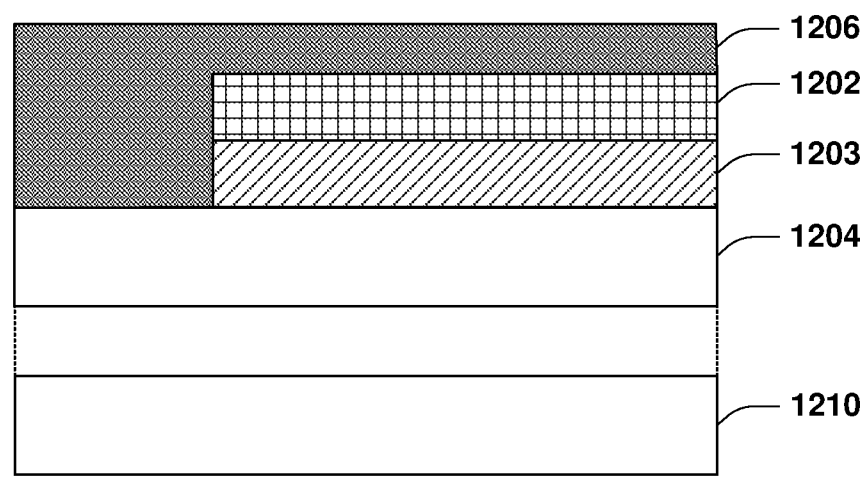

Referring to FIG. 18, a second dielectric layer 1206 is formed over the dielectric layer 1202 and the etch stop layer 1204, in accordance with some embodiments. According to some embodiments, the second dielectric layer 1206 functions to isolate the semiconductor device 1200 for back end of line (BEOL) metallization. In some embodiments, the second dielectric layer 1206 is formed by at least one of ALD, CVD, PVD, or other applicable techniques. In some embodiments, the second dielectric layer 1206 comprises at least one of a nitride, a high-k dielectric constant material, or other applicable materials. In some embodiments, the second dielectric layer 1206 is formed to be in direct contact with the dielectric layer 1202. In some embodiments, the second dielectric layer 1206 is formed to be in direct contact with the etch stop layer 1204. In some embodiments, the second dielectric layer 1206 comprises a same material composition as the dielectric layer 1202. In some embodiments, the second dielectric layer 1206 does not comprise a same material composition as the dielectric layer 1202.

In some embodiments, a method of fabricating a semiconductor device comprises forming a first metal layer over a semiconductor substrate. In some embodiments, the method comprises forming a first layer over the first metal layer. In some embodiments, the method comprises etching the first layer and first metal layer to expose a sidewall of the first layer and a sidewall of the first metal layer, wherein the etching disburses a portion of the first metal layer to create an accumulation of material on at least one of the sidewall of the first layer or the sidewall of the first metal layer. In some embodiments, the method comprises etching the accumulation using an etchant comprising fluorine to remove at least some of the accumulation.

In some embodiments, a method of fabricating a semiconductor device comprises forming a plurality of layers over a semiconductor substrate. In some embodiments, the method comprises etching the plurality of layers to expose a sidewall of at least one of the plurality of layers, wherein the etching creates an accumulation of material on the sidewall of the at least one of the plurality of layers. In some embodiments, the method comprises etching the accumulation using a first etchant comprising fluorine to remove at least some of the accumulation.

In some embodiments, a method of fabricating a semiconductor device comprises forming a first metal layer over a semiconductor substrate. In some embodiments, the method comprises forming a first dielectric layer over the first metal layer. In some embodiments, the method comprises forming a second metal layer over the first dielectric layer and forming a second dielectric layer over the second metal layer. In some embodiments, the method comprises etching the second dielectric layer, the first dielectric layer, and the first metal layer to expose a sidewall of the second dielectric layer, a sidewall of the first dielectric layer, and a sidewall of the first metal layer, wherein a sidewall of the second metal layer is spaced apart from the sidewall of the second dielectric layer by a portion of the second dielectric layer. According to some embodiments, the etching disburses a portion of the first metal layer to create an accumulation of material on at least one of the sidewall of the second dielectric layer, the sidewall of the first dielectric layer, or the sidewall of the first metal layer. In some embodiments, the method comprises etching the accumulation using an etchant comprising fluorine to remove at least some of the accumulation.

The foregoing outlines features of several embodiments so that those of ordinary skill in the art may better understand various aspects of the present disclosure. Those of ordinary skill in the art should appreciate that they may readily use the present disclosure as a basis for designing or modifying other processes and structures for carrying out the same purposes and/or achieving the same advantages of various embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as at least one of etching techniques, planarization techniques, implanting techniques, doping techniques, spin-on techniques, sputtering techniques, growth techniques, or deposition techniques such as chemical vapor deposition (CVD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A method for fabricating a semiconductor device, comprising:
   forming a first metal layer over a semiconductor substrate;
   forming a first layer over the first metal layer and contacting the first metal layer;
   forming a second metal layer over the first layer and contacting the first layer;
   etching the first layer and the first metal layer to expose a sidewall of the first layer and a sidewall of the first metal layer, wherein the etching disburses a portion of the first metal layer to create an accumulation of material on at least one of the sidewall of the first layer or the sidewall of the first metal layer; and
   etching the accumulation using an etchant comprising fluorine to remove at least some of the accumulation.

2. The method of claim 1, wherein the first metal layer comprises at least one of tantalum nitride or titanium nitride.

3. The method of claim 1, wherein forming the first metal layer comprises forming the first metal layer over an etch stop layer.

4. The method of claim 1, comprising:
   forming a dielectric layer over the second metal layer, and
   forming a third metal layer over the dielectric layer.

5. The method of claim 4, wherein the first metal layer, the second metal layer, and the third metal layer have a same composition.

6. The method of claim 5, wherein the first layer has a composition that is different than the composition of the first metal layer, the second metal layer, and the third metal layer.

7. The method of claim 1, wherein the etchant comprises at least one of $CF_4$, $SF_6$, $NF_3$, or $CHF_3$.

8. A method for fabricating a semiconductor device, comprising:
   forming a plurality of layers over a semiconductor substrate, comprising:
      forming a first metal layer over a semiconductor substrate;
      forming a first layer over the first metal layer and contacting the first metal layer;
      forming a second metal layer over the first layer and contacting the first layer;
   etching the plurality of layers to expose a sidewall of the first metal layer, a sidewall of the first layer, and a sidewall of the second metal layer, wherein the etching creates an accumulation of material on the sidewall of the first metal layer, the sidewall of the first layer, and the sidewall of the second metal layer; and
   etching the accumulation using a first etchant comprising fluorine to remove at least some of the accumulation.

9. The method of claim 8, wherein the accumulation comprises metal atoms from at least one of the plurality of layers.

10. The method of claim 8, wherein the first etchant comprises at least one of $CF_4$, $SF_6$, $NF_3$, or $CHF_3$.

11. The method of claim 8, wherein:
    the plurality of layers comprises a first dielectric layer over the second metal layer, and
    the accumulation is present on a sidewall of the first dielectric layer.

12. The method of claim 8, wherein etching the plurality of layers comprises etching the plurality of layers using a second etchant different than the first etchant.

13. The method of claim 12, wherein the second etchant comprises carbon.

14. The method of claim 13, wherein the accumulation comprises metal atoms from at least one of the plurality of layers and carbon atoms from the second etchant.

15. The method of claim 8, wherein:
    forming the plurality of layers comprises forming an etch stop layer over the semiconductor substrate prior to forming the first metal layer, wherein etching the plurality of layers exposes the etch stop layer.

16. A method for fabricating a semiconductor device, comprising:
    forming a first metal layer over a semiconductor substrate;
    forming a first dielectric layer over the first metal layer;
    etching the first dielectric layer and the first metal layer to expose a sidewall of the first dielectric layer and a sidewall of the first metal layer, wherein the etching disburses a portion of the first metal layer to create an accumulation of material on at least one of the sidewall of the first dielectric layer or the sidewall of the first metal layer;
    etching the accumulation using an etchant comprising fluorine to remove at least some of the accumulation; and
    forming a second dielectric layer adjacent the sidewall of the first dielectric layer after etching the accumulation.

17. The method of claim 16, wherein forming the second dielectric layer comprises forming the second dielectric layer adjacent the sidewall of the first metal layer after etching the accumulation.

18. The method of claim 16, wherein the etchant comprises at least one of $CF_4$, $SF_6$, $NF_3$, or $CHF_3$.

19. The method of claim 16, wherein:
    forming the first metal layer comprises forming the first metal layer over an etch stop layer, and
    the accumulation of material contacts the etch stop layer.

20. The method of claim 16, wherein etching the first dielectric layer and the first metal layer comprises etching the first dielectric layer and the first metal layer using a second etchant different than the etchant.

* * * * *